United States Patent
Park et al.

(10) Patent No.: US 9,136,488 B2
(45) Date of Patent: Sep. 15, 2015

(54) DEVICES COMPRISING GRAPHENE AND A CONDUCTIVE POLYMER AND RELATED SYSTEMS AND METHODS

(71) Applicant: Massachusetts Institute of Technology, Cambridge, MA (US)

(72) Inventors: Hyesung Park, Cambridge, MA (US); Rachel M. Howden, Cambridge, MA (US); Jing Kong, Winchester, MA (US); Karen K. Gleason, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 20 days.

(21) Appl. No.: 13/904,375

(22) Filed: May 29, 2013

(65) Prior Publication Data

US 2013/0320302 A1    Dec. 5, 2013

Related U.S. Application Data

(60) Provisional application No. 61/653,042, filed on May 30, 2012.

(51) Int. Cl.
     *H01L 29/08*      (2006.01)
     *H01L 35/24*      (2006.01)
     (Continued)

(52) U.S. Cl.
     CPC ........ *H01L 51/4213* (2013.01); *H01L 51/0037* (2013.01); *H01L 51/442* (2013.01);
     (Continued)

(58) Field of Classification Search
     USPC .............. 257/13, 79–103, 918, E27.052, 257/E27.079, E29.036–E29.038, 257/E29.046–E29.048, E29.115, E29.116, 257/E29.194–E29.225, E21.388–E21.393, 257/E21.614, E21.677, E21.371, E21.387, 257/E21.403–E21.407, E21.441, E21.445, 257/E21.448–E21.452, 120, 124, 133, 127, 257/143, 153, 175, E29.315, E21.105, 257/E27.107, E27.03–E27.032, E27.109, 257/E29.109, E21.382–E21.385, 257/E21.695–E21.696, 22, 184, 431, 432; 438/133, 138, 202–208, 234–239; 977/742, 734, 773, 700, 750, 762
See application file for complete search history.

(56) References Cited

U.S. PATENT DOCUMENTS 7,618,680 B2 * 11/2009 Gleason et al. ............ 427/248.1
2010/0255303 A1 * 10/2010 Wardle et al. ................ 428/378
(Continued)

FOREIGN PATENT DOCUMENTS

GB    WO2011041407    *   4/2011
WO    WO 2011/056778      5/2011
(Continued)

OTHER PUBLICATIONS

Wan et al., Graphene—A Promising Material for Organic Photovoltaic Cells, Advanced Materials. Sep. 29, 2011. [Oct. 7, 2013] Retrieved fi-om the internet: http://nanocenter.nanka edu cn/script/nanocenter/pdf/am_2011_xjw.pdf> entire document.*

(Continued)

*Primary Examiner* — Dao H Nguyen
*Assistant Examiner* — Tram H Nguyen
(74) *Attorney, Agent, or Firm* — Wolf, Greenfield & Sacks, P.C.

(57) ABSTRACT

The present invention generally relates to devices comprising graphene and a conductive polymer (e.g., poly(3,4-ethylenedioxythiophene) (PEDOT)), and related systems and methods. In some embodiments, the conductive polymer is formed by oxidative chemical vapor deposition.

11 Claims, 5 Drawing Sheets

(51) Int. Cl.
| | |
|---|---|
| H01L 51/00 | (2006.01) |
| H01L 51/42 | (2006.01) |
| H01L 51/50 | (2006.01) |
| H01L 51/44 | (2006.01) |

(52) U.S. Cl.
CPC ......... *H01L51/5004* (2013.01); *H01L 51/0008* (2013.01); *H01L 51/0046* (2013.01); *H01L 51/0056* (2013.01); *Y02E 10/549* (2013.01)

(56) References Cited

U.S. PATENT DOCUMENTS

| | | | |
|---|---|---|---|
| 2011/0139252 A1 | 6/2011 | Chen et al. | |
| 2011/0301677 A1* | 12/2011 | Hendricks et al. | 607/116 |
| 2012/0080086 A1 | 4/2012 | Yoon et al. | |
| 2012/0097238 A1 | 4/2012 | Isaacs-Sodeye | |
| 2013/0015424 A1* | 1/2013 | Chung et al. | 257/9 |
| 2013/0161596 A1* | 6/2013 | Huang et al. | 257/40 |
| 2014/0183736 A1* | 7/2014 | Cox et al. | 257/741 |
| 2015/0027529 A1 | 1/2015 | Barr et al. | |
| 2015/0044804 A1 | 2/2015 | Barr et al. | |

FOREIGN PATENT DOCUMENTS

| | | |
|---|---|---|
| WO | WO 2011/141706 | 11/2011 |
| WO | WO 2011/163556 | 12/2011 |
| WO | WO 2013/123039 | 8/2013 |
| WO | WO 2013/123046 | 8/2013 |

OTHER PUBLICATIONS

Wan et ah, Graphene—A Promising Material for Organic Photovoltaic Cells, Advanced Materials. Sep. 29, 2011. [Oct. 7, 2013] Retrieved fi-om the internet: http://nanocenter.nanka edu cn/script/nanocenter/pdf/am_2011_xjw.pdf> entire document.*
Alf et al., Chemical vapor deposition of conformal, functional, and responsive polymer films. Adv Mater. May 11, 2010;22(18):1993-2027.
Bae et al., Roll-to-roll production of 30-inch graphene films for transparent electrodes. Nat Nanotechnol. Aug. 2010;5(8):574-8. Epub Jun. 20, 2010.
Barr et al., Direct Monolithic Integration of Organic Photovoltaic Circuits on Unmodified Paper. Advanced Materials 2011, 23, (31), 3500-3505.
Baxamusa et al., Initiated and oxidative chemical vapor deposition: a scalable method for conformal and functional polymer films on real substrates. Phys Chem Chem Phys. Jul. 14, 2009;11(26):5227-40. Epub Mar. 26, 2009.
Fujishima et al., Organic thin-filmsolarcellemployinganovelelectron-donormaterial. Solar Energy Materials and Solar Cells 2009, 93, (6-7), 1029-1032.
Gunes et al., Conjugated polymer-based organic solar cells. Chem Rev. Apr. 2007;107(4):1324-38.
Im et al., Doping level and work function control in oxidative chemical vapor deposited poly (3,4-ethylenedioxythiophene). Applied Physics Letters. 2007, 90, (15), 152112.
Li et al., Large-area synthesis of high-quality and uniform graphene films on copper foils. Science. Jun. 5, 2009;324(5932):1312-4. Epub May 7, 2009.
Lock et al., Oxidative Chemical Vapor Deposition of Electrically Conducting Poly(3,4-ethylenedioxythiophene) Films. Macromolecules. 2006, 39 (16), 5326-5329.
Milliron et al., Surface oxidation activates indium tin oxide for hole injection. Journal of Applied Physics. Jan. 1, 2000, 87, (1), 572-576.
Murakami et al., Surface modification of polystyrene and poly(methyl methacrylate) by active oxygen treatment. Colloids and Surfaces B: Biointerfaces. 2003, 29, (2-3), 171-179.
Park et al., Doped graphene electrodes for organic solar cells. Nanotechnology. Dec. 17, 2010;21(50):505204. Epub Nov. 23, 2010.
Park et al., Graphene as transparent conducting electrodes in organic photovoltaics: studies in graphene morphology, hole transporting layers, and counter electrodes. Nano Lett. Jan. 11, 2012;12(1):133-40. Epub Dec. 1, 2011.
Park et al., Organic solar cells with graphene electrodes and vapor printed poly(3,4-ethylenedioxythiophene) as the hole transporting layers. ACS Nano. Jul. 24, 2012;6(7):6370-7. Epub Jun. 28, 2012.
Park et al., Work function of indium tin oxide transparent conductor measured by photoelectron spectroscopy. Applied Physics Letters 1996, 68, (19), 2699-2701.
Peumans et al., Very-high-efficiency double-heterostructure copper phthalocyanine/ C 60 photovoltaic cells Applied Physics Letters. 2001, 79, (1),126-128.
Reina et al., Large area, few-layer graphene films on arbitrary substrates by chemical vapor deposition. Nano Lett. Jan. 2009;9(1):30-5.
Wang et al., Large area, continuous, few-layered graphene as anodes in organic photovoltaic devices. Applied Physics Letters 2009, 95, (6), 063302.
Wang et al., Interface engineering of layer-by-layer stacked graphene anodes for high-performance organic solar cells. Adv Mater. Apr. 5, 2011;23(13):1514-8. Epub Jan. 28, 2011.
International Search Report and Written Opinion dated May 27, 2013 for Application No. PCT/US2013/025923.
International Preliminary Report on Patentability mailed Aug. 28, 2014 for Application No. PCT/US2013/025923.
International Search Report and Written Opinion mailed Dec. 16, 2013 for Application No. PCT/US2013/025935.
International Preliminary Report on Patentability mailed Aug. 28, 2014 for Application No. PCT/US2013/025935.
International Preliminary Report on Patentability mailed Dec. 11, 2014 for Application No. PCT/US2013/043050.
Invitation to Pay Additional Fees mailed Apr. 23, 2013 for Application No. PCT/US2013/025935.
Admassie et al., A polymer photodiode using vapour-phase polymerized PEDOT as an anode. Solar Energy Materials and Solar Cells. Jan. 23, 2006;90(2):133-41.
Ajuria et al., Inverted ITO-free organic solar cells based on p and n semiconducting oxides. New designs for integration in tandem cells, top or bottom detecting devices, and photovoltaic windows. Energy and Environ Sci. 2011;4:453-8.
Baierl et al., Efficient indium—tin—oxide (ITO) free top-absorbing organic phtodetector with highly transparent polymer top electrode. Organics Electronics. Jun. 21, 2011;12(10):1669-73.
Borrelli et al., Bilayer heterojunction polymer solar cells using unsubstituted polythiophene via oxidative chemical vapor deposition. Solar Energy Materials and Solar Cells. Dec. 26, 2011;99:190-6.
Brabec et al., Polymer-Fullerene Bulk-Heterojunction Solar Cells. Adv Mater. 2010;22(34):3839-56.
Brown et al., Improved current extraction from ZnO/PbS quantum dot heterojunction photovoltaics using a MoO3 interfacial layer. Nano Lett. Jul. 13, 2011;11(7):2955-61. doi: 10.1021/nl201472u. Epub Jun. 10, 2011.
Chen et al., Flexible Polymer Photovoltaic Devices Prepared With Inverted Structures on Metal Foils. Ieee Electron Device Lett. 2009;30(7):727-9.
Chen et al., Recent Progress in Polymer Solar Cells: Manipulation of Polymer:Fullerene Morphology and the Formation of Efficient Inverted Polymer Solar Cells. Adv Mater. 2009;14-15:1434-1449.
Forrest, The path to ubiquitous and low-cost organic electronic appliances on plastic. Nature. Apr. 29, 2004;428(6986):911-8.
Gadisa et al., Transparent polymer cathode for organic photovoltaic devices. Synthetic Metals. 2006;156:1102-7.
Glatthaar et al., Organic solar cells using inverted layer sequence. Thin Solid Films. 2005;491:298-300.
Hancox et al., Increased efficiency of small molecule photovoltaic cells by insertion of a MoO3 hole-extracting layer. Energy and Environ Sci. 2010;3:107-110.
Hau et al., A Review on the Development of the Inverted Polymer Solar Cell Architecture. Polymer Reviews. 2010;50(4):474-510.
Hau et al., Indium tin oxide-free semi-transparent inverted polymer solar cells using conducting polymer as both bottom and top electrodes. Organic Electronics. 2009;10:1401-7.

(56) References Cited

OTHER PUBLICATIONS

Hsiao et al., All-solution-processed inverted polymer solar cells on granular surface-nickelized polyimide. Org Electron. 2009;10(4):551-61.

Huang et al., Investigation of the Effects of Doping and Post-Deposition Treatments on the Conductivity, Morphology, and Work Function of Poly(3,4 ethylenedioxythiophene)/Poly(styrene sulfonate) Films. Adv Func Mater. 2005;15(2):290-6.

Hubler et al., Printed paper photovoltaic cells. Adv Energy Mater. 2011;1:1018-1022.

Im et al., Systematic Control of the Electrical Conductivity of Poly(3,4-ethylenedioxythiophene) via Oxidative Chemical Vapor Deposition. Macromol. 2007;40(18):6652-6.

Jakobsson et al., Towards all-plastic flexible light emitting diodes. Chem Phys Lett. 2006;433:110-114.

Kim et al., Kelvin probe and ultraviolet photoemission measurements of indium tin oxide work function: a comparison. Synth Met. 2000;111:311-4.

Kim et al., The effect of molybdenum oxide interlayer on organic photovoltaic cells. Appl Phys Lett. 2009;95:093304.

Kim et al., Highly Conductive PEDOT:PSS Electrode with Optimized Solvent and Thermal Post-Treatment for ITO-Free Organic Solar Cells. Adv Func Mater. 2011;21(6):1076-81.

Kinoshita et al., Independent control of open-circuit voltage of organic solar cells by changing film thickness of $MoO_3$ buffer layer. Appl Phys Lett. 2008;92:243309.

Kirchmeyer et al., Scientific importance, properties and growing applications of poly(3,4-ethylenedioxythiophene). J Mater Chem. 2005;15:2077-88.

Kuwabara et al., Highly durable inverted-type organic solar cell using amorphous titanium oxide as electron collection electrode inserted between ITO and organic layer. Solar Energy Materials and Solar Cells. Jul. 25, 2008;92(11):1476-82.

Lamprecht et al., Organic photodiodes on newspaper. Physica status solidi (a). 2005;202(5):R50-52.

Li et al., Efficient inverted polymer solar cells. Appl Phys Lett. 2006;88:253503.

Li et al., Open circuit voltage enhancement due to reduced dark current in small molecule photovoltaic cells. Appl Phys Lett. 2009;94(2):023307.

Li et al., An inverted polymer photovoltaic cell with increased air stability obtained by employing novel hole/electron collecting layers. J Mater Chem. 2009;19(11):1643-7.

Liao et al., Highly efficient inverted polymer solar cell by low temperature annealing of $Cs_2CO_3$ interlayer. Appl Phys Lett. 2008;92:173303.

Lindell et al., Transparent, Plastic, Low-Work-Function Poly(3,4-ethylenedioxythiophene) Electrodes. Chem Mater. 2006;18(18):4246-52.

Lunt et al., Transparent, near-infrared organic photovoltaic solar cells for window and energy-scavenging applications. Appl Phys Lett. 2011;98:113305.

McCullough, The Chemistry of Conducting Polythiophenes. Adv Mater. 1998;10(2):93-116.

Meiss et al., Improved light harvesting in tin-doped indum oxide (ITO)-free inverted bulk-heterojunction organic solar cells using capping layers. Appl Phys Lett. 2008;93:103311.

Meyer et al., Effect of contamination on the electronic structure and hole-injection properties of $MoO_3$/organic semiconductor interfaces. Appl Phys Lett. 2010;96:133308.

Na et al., Efficient and Flexible ITO-Free Organic Solar Cells Using Highly Conductive Polymer Anodes. Adv Mater. 2008;20(21):4061-4067.

Nickel et al., Cathodes comprising highly conductive poly(3,4-ethylenedioxythiophene):poly(styrenesulfonate) for semi-transparent polymer solar cells. Org Electron. 2010;11(4):535-8.

No Author Listed, Heliatek achieves new world record for organic solar cells with certified 9.8% cell efficiency. Heliatek press release. 2011. Accessed online Mar. 19, 2015 at heliatek.com/?p=1346&lang=en.

Nyholm et al., Toward Flexible Polymer and Paper-Based Energy Storage Devices. Adv Mater. 2011;23(33):3751-69.

Osikowicz et al., Transparent low-work-function indium tin oxide electrode obtainedby molecular scale interface engineering. Appl Phys Lett. 2004;85:1616.

Parthasarathy et al., A metal-free cathode for organic semiconductor devices. Appl Phys Lett. 1998;72:2138.

Pettersson et al., Modeling photocurrent action spectra of photovoltaic devices based on organic thin films. J Appl Phys. 1999;86:487.

Peumans et al., Small molecular weight organic thin-film photodetectors and solar cells. J Appl Phys. 2003;93(7):3693-3723.

Pfuetzner et al., Thick $C_{60}$:ZnPc bulk heterojunction solar cells with improved performance by film deposition on heated substrates. Appl Phys Lett. 2009;94:253303.

Po et al., The role of buffer layers in polymer solar cells. Energy Environ Sci. 2011;4:285-310.

Rider et al., Stable Inverted Polymer/Fullerene Solar Cells Using a Cationic Polythiophene Modified PEDOT:PSS Cathodic Interface. Adv Funct Mater. 2010;20(15):2404-2415.

Shrotriya et al., Transition metal oxides as the buffer layer for polymer photovoltaic cells . Appl Phys Lett. 2006;88:0703508.

Siegel et al., Foldable Printed Circuit Boards on Paper Substrates. Adv Mater. 2010;20(1)28-35.

Song et al., Degradation of small-molecule organic solar cells. Appl Phys Lett. 2006;89:251118.

Sun et al., Efficient, Air-Stable Bulk Heterojunction Polymer Solar Cells Using $MoO_x$ as the Anode Interfacial Layer. Adv Mater. 2011;23(19):2226-30.

Tao et al., Performance improvement of inverted polymer solar cells with different top electrodes by introducing a $MoO_3$ bufferlayer. Appl Phys Lett. 2008;93(19):193307.

Tao et al., Highly efficient polycarbazole-based organic photovoltaic devices. Appl Phys Lett. 2009;95:063304.

Tenhaeff et al., Initiated and Oxidative Chemical Vapor Deposition of Polymeric Thin Films: iCVD and oCVD. Adv Funct Mater. 2008;18:979-992.

Tobjork et al., Paper Electronics. Adv Mater. 2011;23(17):1935-61.

Tong et al., Inverted organic photovoltaic cells with high open-circuit voltage. Organic Electronics. 2010;11:705-9.

Waldauf et al., Highly efficient inverted organic photovoltaics using solution based titanium oxide as electron selective contact. Appl Phys Lett. 2006;89:233517.

Wang et al., Papery solar cells based on dielectric/metal hybrid transparent cathode. Sol Energy Mater and Sol Cells. 2010;94(7):1270-4.

Wang et al., High-performance metal-free solar cells using stamp transfer printed vapor phase polymerized poly(3,4-ethylenedioxythiophene) top anodes. Adv Funct Mater. Feb. 2, 2012;22(7):1454-60.

Winther-Jensen et al., High-conductivity large-area semi-transparent electrodes for polymer photovoltaics by silk screen printing and vapour-phase deposition. 2006;90(2):123-132.

Zhang et al., Inverted small molecule organic solar cells with Ca modified ITO as cathode and $MoO_3$ modified Ag as anode. Sol Energy Mater Sol Cells. 2010;94(12):2416-21.

Zschieschang et al., Organic Electronics on Banknotes. Adv Mater. 2010;23(5):654-8.

International Search Report and Written Opinion for International Patent Application No. PCT/US2013/043050, mailed Oct. 16, 2013.

Wan et al., Graphene—a promising material for organic photovoltaic cells. Adv Mater. Dec. 1, 2011;23(45):5342-58. Epub Sep. 29, 2011.

\* cited by examiner

DEVICES COMPRISING GRAPHENE AND A CONDUCTIVE POLYMER AND RELATED SYSTEMS AND METHODS

RELATED APPLICATIONS

The present application claims priority under 35 U.S.C. §119(e) to U.S. provisional application, U.S. Ser. No. 61/653,042, filed May 30, 2012, entitled "DEVICES COMPRISING GRAPHENE AND A CONDUCTIVE POLYMER AND RELATED SYSTEMS AND METHODS," incorporated herein by reference in its entirety for all purposes.

FIELD OF THE INVENTION

The present invention generally relates to devices comprising graphene and a conductive polymer (e.g., poly(3,4-ethylenedioxythiophene) (PEDOT)), and related systems and methods. In some embodiments, the conductive polymer is formed by oxidative chemical vapor deposition.

BACKGROUND OF THE INVENTION

Graphene is generally a hexagonal arrangement of carbon atoms forming a one-atom thick planar sheet. The successful isolation of single- and few-layer graphene by the mechanical cleaving of highly ordered pyrolytic graphite (HOPG) has led to a significant increase in studies in numerous research areas. Of the many interesting properties of graphene (such as superior electron and hole mobility (up to 200,000 cm$^2$ V$^{-1}$s$^{-1}$), high current carrying capability (up to 3×10$^8$ A cm$^{-2}$)), its uniformly high transparency in the visible and near infrared region, with good electrical conductivity and mechanical robustness, place graphene as a promising candidate for an alternative to indium tin oxide (ITO) as a transparent conducting electrode (TCE).

Several criteria, such as electrical conductivity, optical transmittance, and work function (WF), need to be optimized for the integration of graphene sheets as TCEs in organic photovoltaics (OPV). Generally, graphene has high transmittance with moderate conductivity. An important factor, however, is the energy level alignment between the work function of graphene and the highest occupied molecular orbital (HOMO) of the electron donor material. A WF value of 4.27 eV (electron volts) for a monolayer of graphene synthesized from LPCVD has been observed, which is lower than for ITO (~4.5 eV and can be increased up to ~5.0 eV after oxygen (O$_2$) plasma treatment). This low value for graphene is not a good match for the electron donor material (such as tetraphenyldibenzoperiflanthene (DBP), HOMO=5.5 eV), copper phthalocyanine (CuPc), (HOMO=5.2 eV) or poly(3-hexylthiophene) (P3HT), (HOMO=5.2 eV), which can induce a large energy barrier at the interface between the graphene and the organic layer.

For ITO anodes, a thin layer of conducting polymer, poly(3,4-ethylenedioxythiophene):poly(styrenesulfonate) (PEDOT:PSS), may be inserted before the deposition of the electron donor material in order to favor an ohmic-contact at the junction. The PEDOT:PSS hole transporting layer (HTL) with a WF of 5.2 eV facilitates the injection/extraction of holes and/or helps planarize the rough surface of the ITO, which often becomes a possible source of local shorting through the ultra-thin active layers, thus improving the overall device performance. Therefore smooth and complete coverage of the PEDOT:PSS layer on the underlying electrode surface plays a crucial role in the general OPV device performance. Application of PEDOT:PSS onto the graphene surface has been challenging due to the fact that graphene surface is hydrophobic but PEDOT:PSS is in an aqueous solution. The sputtered ITO surface is also hydrophobic but it is almost always pretreated with O$_2$ plasma, which renders the hydrophobic surface into an hydrophilic one by introducing hydroxyl (OH) and carbonyl (C=O) groups that enables conformal coverage of PEDOT:PSS. Active oxygen species from the plasma disrupt the aromatic rings of the graphene and greatly reduces the conductivity. In the case of single layer graphene electrodes, a graphene film can completely lose the conductivity after such plasma treatments.

Recently, the wettability of PEDOT:PSS on the graphene surface was improved by doping it with gold (III) chloride (AuCl$_3$). However, the doping process introduces large Au particles (up to 100 nm in diameter), which can create shorting pathways through the device. This method is less favorable also due to the high cost of AuCl$_3$ dopant. Molybdenum oxide (MoO$_3$) HTL with acid-doped graphene electrodes, which is a common HTL material used with ITO electrodes has also been used. However, the device performance was not as efficient as the ITO control device with a MoO$_3$ layer alone and still required the use of PEDOT:PSS on top of the MoO$_3$ interfacial layer, which allowed better wetting of PEDOT:PSS on the MoO$_3$-coated graphene.

Accordingly, improved devices, systems, and methods are needed.

SUMMARY OF THE INVENTION

In some embodiments, an electromagnetic radiation absorbing and/or emitting device is provided comprising a substrate comprising graphene; and poly(3,4-ethylenedioxythiophene) (PEDOT) formed on at least a portion of the graphene, wherein the PEDOT is formed by oxidative chemical vapor deposition.

In some embodiments, a method is provided comprising providing a substrate comprising graphene; and depositing, via oxidative chemical vapor deposition, poly(3,4-ethylenedioxythiophene) (PEDOT) on at least a portion of the graphene.

In some embodiments, a small molecule organic photovoltaic device is provided comprising a graphene anode; wherein the power conversion efficiency of the device is at least about 3.0%.

Other aspects, embodiments, and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The present invention generally relates to devices comprising graphene and a conductive polymer (e.g., poly(3,4-ethylenedioxythiophene) (PEDOT)), and related systems and methods. In some embodiments, conductive polymer is formed by oxidative chemical vapor deposition (oCVD). In some embodiments, the device is an electromagnetic radiation absorbing and/or emitting device (e.g., a photovoltaic cell).

Electromagnetic radiation absorbing and/or emitting devices (e.g., photovoltaic cells) will be known to those of ordinary skill in the art. Generally, an electromagnetic radiation absorbing and/or emitting device comprises at least a substrate, a first electrode, a second electrode associated with the substrate, a photoactive material disposed between the first electrode and the second electrode, and optionally, a first electrode buffer material disposed between the first electrode and the photoactive material and/or a second electrode buffer material layer disposed between the second electrode and the photoactive material. The device may be exposed to electromagnetic radiation through the substrate (e.g., convention photovoltaic cell) or through the first electrode which is not associated with the substrate (e.g., inverted photovoltaic cell). Electromagnetic radiation absorbing and/or emitting device (e.g., photovoltaic cells), components, orientations, and methods of use will be known to those of ordinary skill in the art.

It should be understood, that while many of the embodiments described herein are discussed in relation to photovoltaic cells, this is by no means limiting, and other electromagnetic radiation absorbing and/or emitting devices may be employed. Similarly, while much of the disclosure provided herein relates to the conductive polymer being PEDOT, this is by no means limiting, and other conductive polymers may be employed in the methods, systems, and devices described herein.

In some embodiments, the methods, devices, and systems of the present invention comprise a substrate comprising graphene and a conductive polymer (e.g., PEDOT) formed on at least a portion of the graphene. In some embodiments, the conductive polymer is formed via oCVD. In some embodiments, the device, system, or method comprises PEDOT formed via oCVD. In some embodiments, methods are provided for forming a device comprising a substrate comprising graphene and PEDOT associated with at least a portion of the graphene. In some embodiments, a method comprises providing a substrate comprising graphene and depositing, via oCVD, a poly(3,4-ethylenedioxythiophene) polymer (PEDOT) on at least a portion of the graphene. The PEDOT polymer formed by oCVD may be transparent or substantially transparent.

Without wishing to be bound by theory, association of PEDOT (or other conductive polymer) with graphene via oCVD leads to surprising and unexpected results of the final device or system as compared to devices or systems comprising a polymeric material comprising PEDOT associated with graphene, wherein the polymer material comprising PEDOT is not formed by oCVD. In some embodiments, this may be due to the lack of solution processing steps required for the device/system wherein PEDOT is formed by oCVD. For example, the relatively mild deposition conditions (e.g., low temperature, moderate pressure, lack of solvent use, etc.) oCVD techniques may allow for PEDOT to be deposited without damaging and/or delaminating the graphene. Furthermore, the fabrication of such devices and systems has a number of advantages as compared to current methods. For example, in some embodiments, PEDOT may be associated with the graphene in a single step, optionally in a pattern.

oCVD techniques will be known to those of ordinary skill in the art and are described in the literature, for example, see, M. E. Alf et al., Adv. Mater. 22, 1993 (2010); and S. H. Baxamusa, S. G. Im, K. K. Gleason, Phys. Chem. Chem. Phys. 11, 5227 (2009), each herein incorporated by reference. As will be known to those of ordinary skill in the art, oCVD, is a solvent-free, vacuum-based technique, in which conjugated polymer films are formed directly on the substrate by oxidative polymerization of vapor-phase monomer(s) and oxidant precursor(s) at low temperature (25-150° C.) and under moderate vacuum (~0.1 Torr). Well-defined polymer patterns can be "vapor-printed" on the material of choice when this process is combined with in situ shadow masking. Thus, oCVD offers an attractive solvent-free route to transparent polymer top electrodes, while maintaining the benefits of vacuum processing, including parallel and sequential deposition, well-defined thickness control and uniformity, and inline compatibility with standard vacuum process (e.g. thermal evaporation). Moreover, oCVD is conformal over nonplanar substrates, enabling compatibility with substrates such as paper and textiles. In contrast, vacuum thermal evaporation is generally subject to line-of-sight deposition, while conformal deposition of liquid-phase systems is complicated by surface tension effects around micro- and nano-scale features.

In some embodiments, oCVD methods comprise providing a vapor-phase monomer species and a vapor-phase oxidizing agent to produce a vapor comprising a conductive polymer precursor and contacting the vapor with the surface to form the electrode comprising a conductive polymer on the surface. In some embodiments, due to presence of excess oxidizing agent, a doped or oxidized polymer species may be generated in vapor phase and may form on the surface. In an illustrative embodiment, the method may involve oxidative polymerization of thiophene to a doped form of polythiophene, wherein the polythiophene is in oxidized form and contains polarons and bipolarons.

The oCVD methods may be carried out using any suitable conditions. In some embodiments, the oCVD methods are carried out at a temperature of about 25° C., about 30° C., about 40° C., about 50° C., about 60° C., about 70° C., about 80° C., about 90° C., about 100° C., about 110° C., about 120° C., about 125° C., about 130° C., about 140° C., or about 150° C. In some embodiments, the oCVD methods may be carried out at a temperature between about 25° C. and about 150° C., or between about 50° C. and about 125° C., or between about 75° C. and about 125° C. In some embodiments, the oCVD methods may be carried out at a pressure of about 0.001 Torr, about 0.002 Torr, about 0.003 Torr, about 0.004 Torr, about 0.005 Torr, about 0.006 Torr, about 0.007 Torr, about 0.008

Torr, about 0.009 Torr, about 0.01 Torr, about 0.02 Torr, about 0.03 Torr, about 0.04 Torr, about 0.05 Torr, about 0.06 Torr, about 0.07 Torr, about 0.08 Torr, about 0.09 Torr, or about 0.1 Torr, or any suitable range therein.

The oCVD processes may be carried out for any suitable period of time. As will be known to those of ordinary skill in the art, generally, the thickness of the resulting conductive polymer depends on the time the oCVD process is carried out (e.g., longer oCVD time, increased thickness of conductive polymer). In some embodiments, the oCVD process may be carried out for about 30 seconds, about 1 minutes, about 2 minutes, about 3 minutes, about 4 minutes, 5 minutes, about 6 minutes, about 7 minutes, about 8 minutes, about 9 minutes, about 10 minutes, about 15 minutes, about 20 minutes, about 30 minutes, about 45 minutes, about 60 minutes, or greater, or any suitable range therein. The thickness of the conductive polymer is discussed herein.

As noted above, in some embodiments, the conductive polymer is formed by oCVD on a substrate by oxidative polymerization of vapor-phase monomer(s) and oxidant precursor(s). In some embodiments, oCVD is used to form PEDOT. In such embodiments, the vapor-phase monomer comprises 3,4-ethylenedioxythiphene and the oxidant precursor(s) can include iron (III) chloride.

In some cases, the monomer species is a compound comprising an aryl or heteroaryl group, any of which is optionally substituted. The monomer species may be, for example, an optionally substituted heteroaryl group such as an optionally substituted thiophene. Examples of aryl or heteroaryl groups include, but are not limited to phenyl, naphthyl, tetrahydronaphthyl, indanyl, indenyl, fluorenyl, pyridyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furanyl, quinolinyl, isoquinolinyl, and the like, any of which is optionally substituted. Other non-limiting examples of conductive polymers include is conjugated polymer such as polyacetylene, polyarylene, polyarylene vinylene, or polyarylene ethynylene, any of which are optionally substituted. In some cases, the conjugated polymer is polyphenylene, polythiophene, polypyrrole, polyaniline, or polyacetylene, any of which are optionally substituted.

Additional non-limiting examples of oxidizing agents for use in the oCVD processes include, but are not limited to, $CuCl_2$, $FeCl_3$, $FeBr_3$, $I_2$, $POBr_3$, $GeCl_4$, $ShI_3$, $Br_2$, $SbF_5$, $SbCl_5$, $TiCl_4$, $POCl_3$, $SO_2Cl_2$, $CrO_2Cl_2$, $S_2Cl$, $O(CH_3)_3SbCl_6$, $VCl_4$, $VOCl_3$, $BF_3$, $(CH_3(CH_2)_2)_2O\cdot BF_3$, $(C_2H_5)_3O(BF_4)$, or $BF_3\cdot O(C_2H_5)_2$. In one embodiment, the oxidizing agent is $FeCl_3$. In some embodiments, the amount of oxidizing agent may be varied to tune the work function (WF) of the conductive polymer.

In some embodiments, the methods, devices, or systems described herein comprise a substrate comprising graphene. In some cases, the substrate comprising graphene is an electrode. In some cases, the substrate comprising graphene consists of or consists essentially of graphene. In other cases, however, the substrate comprising graphene comprising graphene and at least one second component. In some cases, the graphene is formed on at least a portion of the surface of the second component. In some cases, the graphene is formed on one surface of the second component. In some cases, the graphene substantially encapsulate the second component. The second component may comprise any suitable material. In some cases, the second component is non-conductive, substantially non-conductive, semi-conductive, substantially conductive, or conductive. Those of ordinary skill in the art will be aware of suitable substrates comprising graphene. In some embodiments, the graphene is unmodified graphene. In some cases, the graphene comprises a single monolayer. In some cases, the graphene comprises a plurality of monolayers. The graphene may or might not have uniform thickness.

In some embodiments, electromagnetic radiation absorbing and/or emitting device are provided, for example, photovoltaic cells. As noted above, in some embodiments, a photovoltaic cell comprises at least a substrate, a first electrode (e.g., a graphene electrode), a second electrode associated with the substrate, a photoactive material disposed between the first electrode and the second electrode, and optionally, a first electrode buffer material disposed between the first electrode and the photoactive material (e.g., PEDOT) and/or a second electrode material layer disposed between the second electrode and the photoactive material. The components of the device (e.g., the first electrode, the second electrode, the photoactive material, the substrate, the buffer materials, etc.) may be transparent, substantially transparent, opaque, or substantially opaque. The device may be exposed to electromagnetic radiation through the substrate (e.g., convention photovoltaic cell) or through the first electrode which is not associated with the substrate (e.g., inverted photovoltaic cell). Photovoltaic cells, components, orientations, and methods of use will be known to those of ordinary skill in the art.

In some embodiments, a photovoltaic cell comprises an anode, a cathode, a photoactive material positioned between anode and the cathode, and a substrate, wherein the cathode is positioned between the photoactive material and the substrate. In some cases, a first electrode buffer material is disposed between the first electrode and the photoactive material and/or a second electrode material layer is disposed between the second electrode and the photoactive material.

In some embodiments, a small molecule organic photovoltaic device is provided comprising a substrate comprising graphene (e.g., an electrode comprising graphene). In some embodiments, the small molecule organic photovoltaic device comprises a graphene electrode and a conductive polymer (e.g., PEDOT) formed on at least a portion of the graphene electrode. In some embodiments, the conductive polymer is formed via oCVD. In some embodiments, PEDOT is formed via oCVD. In some embodiments, the power conversion efficiency of the device is at least about or about 1%, at least about or about 1.2%, at least about or about 1.4%, at least about or about 1.6%, at least about or about 1.8%, at least about or about 2%, at least about or about 2.2%, at least about or about 2.4%, at least about or about 2.6%, at least about or about 2.8%, at least about or about 3%, at least about or about 3.2%, at least about or about 3.4%, at least about or about 3.6%, at least about or about 3.8%, at least about or about 4%, at least about or about 5%, at least about or about 6%, at least about or about 7%, at least about or about 8%, at least about or about 9%, at least about or about 10%, or greater.

Methods described herein may be useful in the fabrication of devices, including photovoltaic devices (e.g. solar, cells), light-emitting diodes, or any device a photoactive material, a first electrode, and a second electrode. In some embodiments, a method of forming a photovoltaic cell comprises providing a substrate comprising graphene (e.g., a graphene electrode) and depositing a conductive polymer on the substrate comprising graphene, e.g., using oCVD. In some cases, the method may further comprise depositing a photoactive material on the conductive polymer; optionally depositing a first electrode buffer material on the photoactive material; and depositing, via oxidative chemical vapor deposition, a first electrode on the photoactive material or on the optionally deposited first electrode buffer material. In some embodiments, the device comprises a substrate (e.g., associated with the first electrode or a second electrode). In some embodiments, the graphene electrode is an anode and the second electrode is a cathode. In other embodiments, the second electrode is an anode and the graphene electrode is a cathode. In some cases, the device is exposed to electromagnetic radiation via the graphene electrode. In some cases, the device is exposed to electromagnetic radiation via the second electrode.

In some embodiments, the efficiency of the photovoltaic cell is greater than about 2%, or about 2.1%, or about 2.2%, or about 2.3%, or about 2.4%, or about 2.5%, or about 2.6%, or about 2.7%, or about 2.8%, or about 2.9%, or about 3.0%. In some embodiments, the efficiency of the photovoltaic cell is between about 2% and about 10%, or between about 2% and about 9%, or between about 2% and about 9%, or between about 2% and about 7%, or between about 2% and about 6%, or between about 2% and about 5%, or between about 2% and about 4%, or between about 2% and about 3%, or between about 2% and about 2.5%.

Each of the components and/or layers of the device (e.g., photovoltaic cell) may be any suitable thickness. In some embodiments, each material may be of substantially uniform thickness (e.g., wherein the thickness of the material does not vary more than 10%, or more than 5%, or more than 1% over the surface of the article). In some cases, the thickness may not be substantially uniform. The thickness of each material may be between about 1 nm and about 1000 nm, or between about 1 nm and about 500 nm, or between about 1 nm and about 300 nm, or between about 1 nm and about 200 nm, or between about 1 nm and about 100 nm, or between about 1 nm and about 50 nm, or between about 10 nm and about 100 nm, or between about 10 nm and about 50 nm, or between about 10 nm and about 40 nm. In some embodiments, the thickness of the each material may be about, or greater than or less than, about 5 nm, about 10 nm, about 15 nm, about 20 nm, about 25 nm, about 30 nm, about 40 nm, about 50 nm, about 60 nm, about 70 nm, about 75 nm, about 80 nm, about 90 nm, about 100 nm, about 150 nm, or about 200 nm.

Those of ordinary skill in the art will be able to select suitable photoactive materials for use in the methods and devices described herein. In some cases, a photoactive material comprises an electron-donating material and an electron-accepting material. Those of ordinary skill in the art will be able to select suitable electron-donating materials (e.g., p-type materials) and electron-acceptor materials (e.g., n-type materials) for use in the embodiments described herein.

The term "p-type material" is given its ordinary meaning in the art and refers to a material that has more positive carriers (holes) than negative carriers (electrons). In some embodiments, the electron-donating material comprises a phthalocyanine, a merocyanine dye, or an optionally substituted conjugated polymer based on polythiophene. Non-limiting examples of electron-donating materials are tetraphenyldibenzoperiflanthene (DBP), copper phthalocyanine, chloroaluminum phthalocyanine, and tin phthalocyanine. Those of ordinary skill in the art will be able to select suitable p-type materials for use in the devices and methods described herein.

The term "n-type material" is given its ordinary meaning in the art and refers to a material that has more negative carriers (electrons) than positive carriers (holes). Non-limiting examples of n-type materials include aromatic hydrocarbons including fullerenes, inorganic nanoparticles, carbon nanorods, inorganic nanorods, polymers containing moieties capable of accepting electrons or forming stable anions, or combinations thereof. In some embodiments, the n-type material is a fullerene, optionally substituted. As used herein, the term "fullerene" is given its ordinary meaning in the art and refers to a substantially spherical molecule generally comprising a fused network of five-membered and/or six-membered aromatic rings. For example, $C_{60}$ is a fullerene which mimics the shape of a soccer ball. The term fullerene may also include molecules having a shape that is related to a spherical shape, such as an ellipsoid. It should be understood that the fullerene may comprise rings other than six-membered rings. In some embodiments, the fullerene may comprise seven-membered rings, or larger. Fullerenes may include $C_{36}$, $C_{50}$, $C_{60}$, $C_{61}$, $C_{70}$, $C_{76}$, $C_{84}$, and the like. Fullerenes may also comprise individual atoms, ions, and/or nanoparticles in the inner cavity of the fullerene. A non-limiting example of a substituted fullerene which may be used as the n-type material is phenyl-$C_{61}$-butyric acid methyl ester. Non-limiting examples of n-type materials are $C_{60}$, 3,4,9,10-perylene tetracarboxylic bisbenzimidazole, $TiO_2$, and ZnO. Those of ordinary skill in the art will be able to select suitable n-type materials for use in the devices and methods described herein.

The substrate can be any material capable of supporting the device components described herein. That is, the substrate may be any material to which a material and/or component described herein may adhere. The substrate may be selected to have a thermal coefficient of expansion similar to those of the other components of the device to promote adhesion and prevent separation of the device components at various temperatures. Non-limiting examples of substrates include glass, plastics, metals, polymers, paper, fabric, and the like. The surface may include those constructed out of more than one material, including coated surfaces (e.g., indium tin oxide-coated glass). Non-limiting examples of surfaces include paper, ceramics, carbon, fabric, nylon, polyester, polyurethane, polyanhydride, polyorthoester, polyacrylonitrile, polyphenazine, latex, teflon, dacron, acrylate polymer, chlorinated rubber, fluoropolymer, polyamide resin, vinyl resin, Gore-tex™, Marlex™, expanded polytetrafluoroethylene (e-polythiopheneFE), low density polyethylene (LDPE), high density polyethylene (HDPE), polypropylene (PP), and poly(ethylene terephthalate) (PET). The substrate may be opaque, semi-opaque, semi-transparent, or transparent. In some embodiments, the substrate is flexible. In other embodiments, the substrate is rigid.

In some embodiments, a device may comprise a first electrode buffer material positioned between the first electrode and the photoactive material and/or a second electrode buffer material positioned between the second electrode and the photoactive material. The buffer materials may reduce the work function of one or more components. Those of ordinary skill in the art will be aware of suitable buffer materials for use in the methods and devices as described herein. Non-limiting examples of buffer materials include metal oxides (e.g., $MoO_3$, $V_2O_5$ or $WO_3$) and bathocuproine (BCP). Those of ordinary skill in the art will be aware of suitable materials for use as a second electrode. In some embodiments, the second electrode is a conductive metal. Non-limiting examples of conductive metals include silver, aluminum, calcium, and gold.

Various components of a device, such as the anode, cathode, substrate, anode buffer material, etc., etc. can be fabricated and/or selected by those of ordinary skill in the art from any of a variety of components. Components may be molded, machined, extruded, pressed, isopressed, infiltrated, coated, in green or fired states, or formed by any other suitable technique. Those of ordinary skill in the art are readily aware of techniques for forming components of devices herein. Electromagnetic radiation may be provided to the systems, devices, electrodes, and/or for the methods described herein using any suitable source.

The following examples are intended to illustrate certain embodiments of the present invention, but are not to be construed as limiting and do not exemplify the full scope of the invention.

Example 1

This example describes a novel HTL fabricated by vapor printing of PEDOT directly onto an unmodified graphene surface. In a single step, vapor printing combined (i) the synthesis of conducting polymer chains from vapor-phase (3, 4 ethylenedioxythiophene) (EDOT) monomer, (ii) thin film formation of the PEDOT HTL, and (iii) patterning by in situ shadow masking. Vapor printing was derived from the oxidative chemical vapor deposition (oCVD) (steps (i) and (ii) only). The oCVD blanket (i.e., unpatterned) PEDOT layers readily integrate with a wide range of substrates, because it is a dry process and substrate temperature is mild (~120° C.), the difficulties with film dewetting and substrate degradation by solvents or high temperatures can be avoided. In addition, the work function (WF) of the oCVD PEDOT layer can be tuned by controlling the doping level of CP ions. The oCVD process was compatible with graphene substrates. The oCVD polymer layer is formed by directly exposing the substrate to vaporized monomer EDOT and an oxidizing agent (in this case, $FeCl_3$) under controlled reactor conditions. The relatively mild deposition conditions (low temperature 120° C., moderate pressure ~10 mTorr, and no use of solvents) allowed for PEDOT to be deposited without damaging or delaminating the graphene electrode. Furthermore, as vapor printing is generally substrate independent, requiring no substrate-specific optimization of the oCVD process or substrate pretreatment, it allowed the direct printing of the PEDOT onto graphene substrates. The graphene based solar cells fabricated with vapor printed PEDOT HTLs achieved ~94% of the performance of their ITO counterparts without any additional treatment to the graphene sheets such as chemical doping.

Graphene films were synthesized under low pressure chemical vapor deposition (LPCVD) on Cu foils (25 μm in thickness and 99.8% purity, ALFA AESAR). This yielded monolayer graphene on the Cu and afterwards, graphene anodes were prepared through layer-by-layer transfers by stacking 3 mono-layers of graphene sheets. The average sheet resistance ($R_{sh}$) and transmittance values of the graphene electrodes were ~300 Ω/sq and ~92% (at 550 nm). FIG. 1a illustrates the graphene synthesis and transfer process. After patterning the graphene electrodes, PEDOT (PEDOT:PSS or vapor printed PEDOT) and organic layers were subsequently deposited followed by the top capping electrode via thermal evaporation. The PEDOT deposition process is illustrated in FIG. 1b. The final device structure in one embodiment was: anode (ITO or graphene)/HTL (PEDOT:PSS or vapor printed PEDOT)/DBP/$C_{60}$ (fullerene)/BCP (bathocuproine)/Al (aluminum). The complete solar cell structure is schematically shown in FIG. 1c and further details are explained herein.

Shown in FIG. 2a are sheet resistance ($R_{sh}$) and transmittance values of vapor printed PEDOT with varying thicknesses. The thinner PEDOT layers (2, 7, and 15 nm) had higher transmittance values (generally >90%) that are presumably better for HTL layers, because losses in optical absorption through the transparent electrode may contribute to decrease in device performance. On the other hand, the sheet resistance decreases with increasing thickness, with an abrupt change from 2 nm to the thicker layers (7, 15, and 40 nm), likely due to the amount of charge pathways increases (as shown in FIG. 2b and Table S1). Having a lower sheet resistance HTL resulted in better charge transfer to the graphene electrode, however, the thicker the HTL, the further the charge must travel through the layer to reach the graphene electrode and the greater the transmission losses due to absorption. Nevertheless, it was found that the thicknesses in the range of at least 7-40 nm gave reasonable performances.

Figure 3:
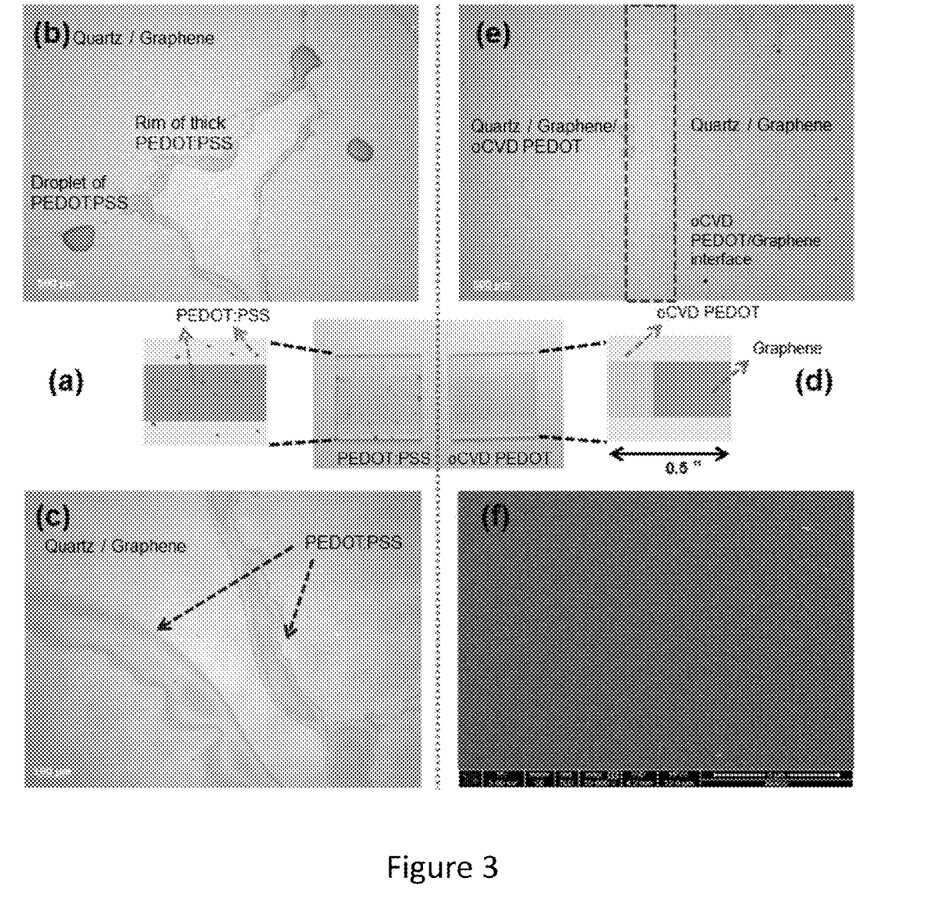
FIG. 3 shows comparison of HTL coverage on quartz/graphene substrate for (a-c) Spin-coated PEDOT:PSS on quartz/graphene substrate, (d-f) oCVD PEDOT coating on quartz/graphene substrate and related schematic illustrations, according to some embodiments.

FIG. 3 shows the optical and SEM images of the graphene/quartz substrate after spin-coating PEDOT:PSS (left images, FIGS. 3(a-c)) in contrast with the vapor printed PEDOT (15 nm) (right images, FIGS. 3(d-f)). The optical image in FIG. 3a shows that most of the spin-casted PEDOT:PSS dewetted over the graphene electrode as well as the adjacent bare quartz (FIGS. 3(b, c) shows more details). The dewetting of the PEDOT:PSS was observed over the entire substrate, which signifies that there is not proper coverage of the graphene surface. In contrast, vapor printing provides a well-defined PEDOT region (light grey) (FIG. 3d). Furthermore, the scanning electron microscopy (SEM) image in higher magnification shows that the coating of vapor printed PEDOT on graphene was uniform in finer detail (FIG. 3f). oCVD PEDOT itself is relatively smooth and conformal coverage on the graphene surface is confirmed by the reduced surface roughness of the pristine graphene. This suggests the understanding that since oCVD is a dry process, the dewetting problem may be avoided or reduced and the PEDOT can form a uniform film on the graphene.

Furthermore, the WF of vapor printed PEDOT on the graphene (3-layers) was evaluated by the Kelvin probe method. The measured value averaged over several regions was ~5.1 eV which was similar to the commonly reported WF value of PEDOT:PSS (~5.2 eV). This observation indicates that the injection/extraction of holes from the HOMO of electron donor can be energetically favorable compared to the interface of graphene only.

Small molecule organic solar cells with graphene anodes were fabricated with device structures mentioned earlier. FIG. 4a displays the current density-voltage (J-V) measurements of devices with various configurations using 3-layer graphene anodes: graphene with spin-coated PEDOT:PSS and vapor printed PEDOT (15 nm) HTLs along with ITO reference. Due to the poor wetting of PEDOT:PSS, graphene device with PEDOT:PSS typically shows the leaky behavior (not a diode behavior but rather like a linear resistor), and with poor photo-response (much smaller $V_{oc}$ and $J_{sc}$). On the other hand, the J-V responses from the devices having vapor printed PEDOT HTLs (with different thicknesses shown in FIGS. 4b and 4c for graphene and ITO electrodes) demonstrated good diode behavior, and performance ($J_{SC}$ (short-circuit current density)=5.69±0.17 mA $cm^{-2}$, $V_{OC}$ (open-circuit voltage)=0.88±0.01 V, FF (fill factor)=0.60±0.01, and $\eta_p$ (power conversion efficiency, PCE)=3.01±0.05%) is comparable to the ITO reference device with PEDOT:PSS ($J_{SC}$=5.14±0.12 mA $cm^{-2}$, $V_{OC}$=0.92±0.01 V, FF=0.68±0.01, and $\eta_p$=3.20±0.05%).

Figure 4:
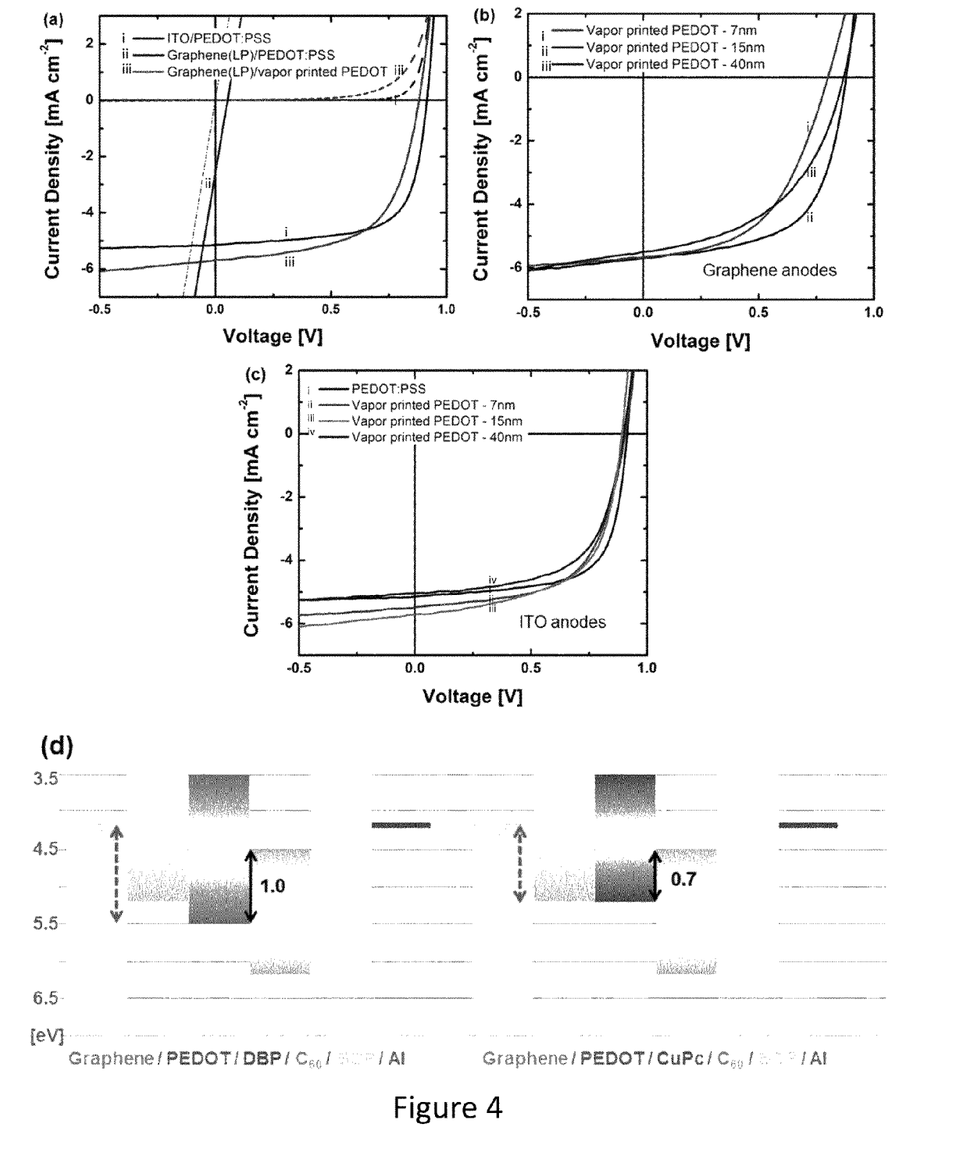
FIGS. 4a-c, 5a-b, and 6a-b show J-V characteristics of various devices, according to some embodiments.
FIG. 4d show flat-band energy level diagram of various OPV device structure, according to some embodiments.
Figure 6:
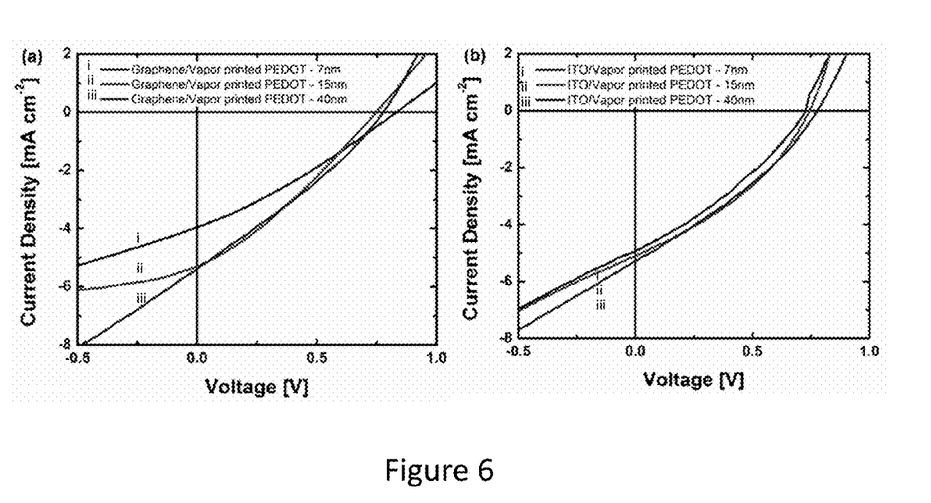

With more devices fabricated using the vapor printed PEDOT on graphene electrodes, many show more ideal diode J-V responses similar to the one presented in FIGS. 4(a-c), and with the some others, less-ideal behaviors have been observed (both for graphene and ITO electrodes), as shown in FIGS. 6a and 6b. This more ideal vs. less-ideal behavior does not appear to be related to the thickness of the vapor printed PEDOT on graphene, as can be seen in both FIGS. 4b and 4c and FIG. 6 for thicknesses between 7-40 nm, the devices have displayed both behaviors. And even within the devices that showed more ideal behaviors, there appear to be no direct correlation between the PCE value and the PEDOT thickness. At present the less-ideal behavior may be due to a process-related issue.

It should be noted that the value of $\eta_p$=3.01% is the highest value reported for a graphene anode and small molecule based OPV (~94% of PCE of ITO based device). Apart from the successful interface engineering by the vapor printed oCVD PEDOT on graphene, another reason for the enhanced performance may be attributed to the increased $V_{OC}$ observed in the cells compared to devices fabricated using CuPc as electron donor materials, one of the most widely used electron donor materials in the small molecules based OPV structure. As shown from the energy level diagram in FIG. 4d, the maximum $V_{OC}$ achievable from DBP/$C_{60}$ pair was ~1.0 V, ~0.3 V higher than CuPc/$C_{60}$. Therefore, improvements in $V_{OC}$ may originate from the deep-lying HOMO level of DBP compared to that of CuPc.

Graphene synthesized from the Cu catalyst under LP condition succeeded in producing high quality mono-layer sheets, which could not be achieved using nickel (Ni) catalyst. However, due to the LPCVD process, achieving multi-layers of graphene from the Cu under LPCVD can be challenging. A mono-layer of graphene sheet is not ideal for use as an electrode due to defects induced from the processing issues such as transfer or patterning, as well as the generally lower conductivity compared to stacked multi-layers ($R_{sh}$ decreases as a function of additional layers). On the other hand, transferring multiple steps to obtain multi-layers may add complexity and cost to the fabrication process. Therefore, in this work, few-layer graphene synthesis were carried out under atmospheric CVD (APCVD) condition using Cu foils, where only one-step transfer was needed for graphene electrodes. Optical and AFM images of the APCVD grown graphene indicated a non-uniform film thickness. The APCVD graphene layers have average sheet resistance and transmittance values of ~450 Ω/sq and ~92% (at 550 nm), respectively. Even though the thicknesses of the APCVD grown graphene layers are non-uniform, the vapor printing of oCVD PEDOT onto these graphene layers was as successful as the LPCVD graphene layers. This is consistent with the general observation that oCVD PEDOT deposition is substrate independent and it coats uniformly on the substrate.

Solar cells fabricated with graphene anodes prepared under APCVD conditions gave performance close to the devices made via LPCVD conditions ($\eta_{p,APCVD}$=2.49% and $\eta_{p,LPCVD}$=3.01%). FIG. 5a shows the J-V characteristics of graphene device with vapor printed PEDOT ($J_{SC}$=5.89±0.03 mA cm$^{-2}$, $V_{OC}$=0.89±0.03 V, FF=0.48±0.01, and $\eta_p$=2.49±0.06%) and ITO reference device with PEDOT:PSS ($J_{SC}$=5.14±0.12 mA cm$^{-2}$, $V_{OC}$=0.92±0.01 V, FF=0.68±0.01, and $\eta_p$=3.20±0.05%). FIG. 5b compares the best device performance using graphene electrodes from different synthesis conditions (LPCVD vs. APCVD), illustrating comparable performances (APCVD graphene performs ~83% of LPCVD graphene).

In summary, a novel method for vapor printing PEDOT onto the graphene surface was described, which yielded well defined patterns using in situ shadow masking. The oCVD process, resulted in smooth, complete coverage of PEDOT on the graphene electrode. In contrast, spin-casting PEDOT:PSS from an aqueous solution did not coat the graphene surface as well due to graphene's low surface free energy. The oCVD process works well on both LPCVD grown graphene (with uniform thicknesses) and APCVD grown graphene (with non-uniform thicknesses). Furthermore, the use of small molecular electron donor material DBP combined with the vapor printed PEDOT HTL, yielded more efficient graphene based devices with performances comparable to those of ITO reference devices. The results here represent a further step forward in the investigation of using graphene as an alternative TCE for the replacement of ITO and open up opportunities in other applications as well, such as organic light-emitting diodes (OLEDs).

Figure 1:
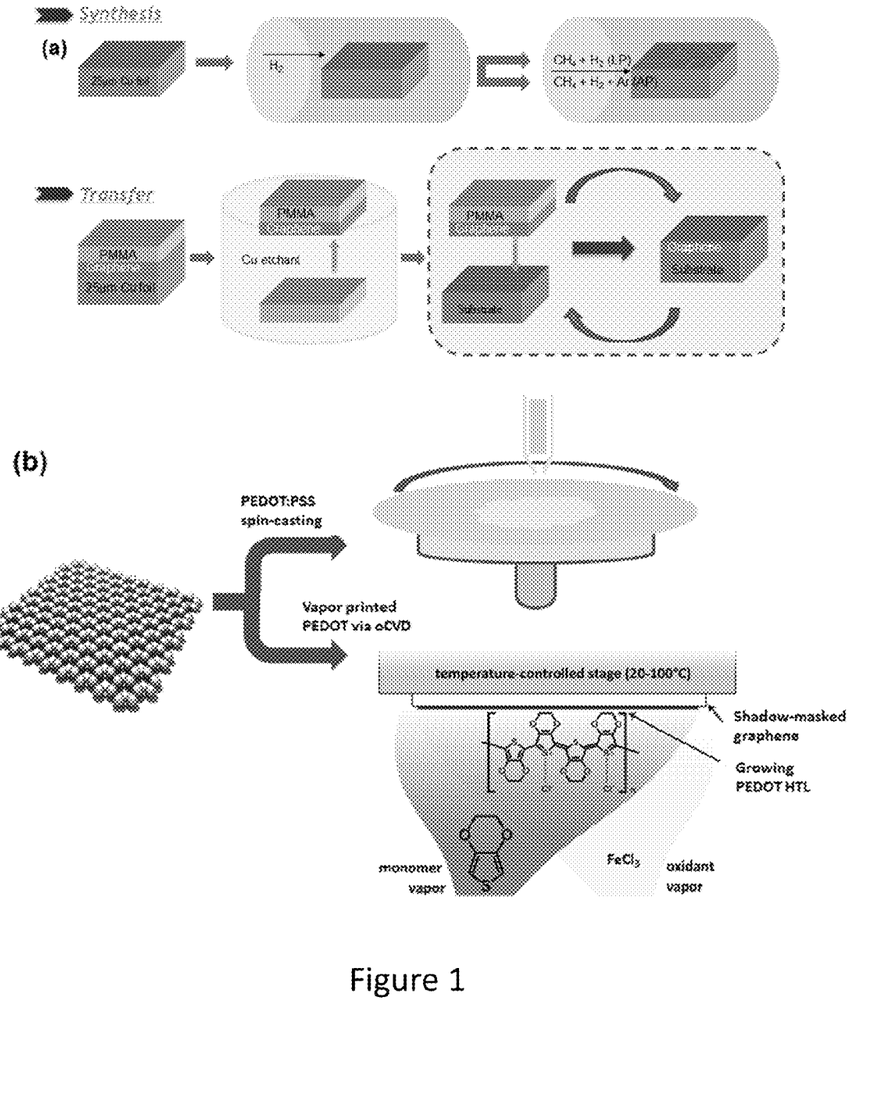
FIG. 1a shows a schematic of graphene synthesis and transfer, according to some embodiments.
FIG. 1b shows a schematic of PEDOT:PSS spin-coating vs. vapor printing of PEDOT deposition, according to some embodiments.
FIG. 1c shows a schematic of a graphene/ITO anode OPV structure, according to some embodiments.

In FIG. 1: Schematics outlining the fabrication process of graphene electrodes, PEDOT HTLs, and OPV devices. (a) Graphene synthesis and transfer. The last part of the transfer procedure is repeated to prepare 3-layer graphene stacks for LPCVD graphene. (b) PEDOT:PSS spin-coating vs. vapor printing of PEDOT deposition. The spin-casting layer covers the graphene and the surrounding quartz substrate while the vapor printed patterns align to produce PEDOT only on the graphene electrodes. (c) Graphene/ITO anode OPV structure: Graphene(or ITO)/PEDOT/DBP/$C_{60}$/BCP/Al.

Figure 2:
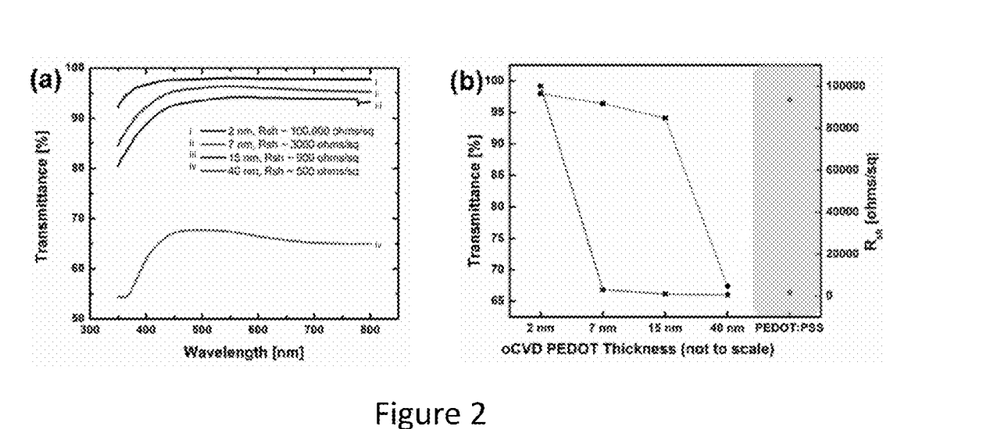
FIG. 2a shows transmittance data for oCVD PEDOT HTL layers, according to some embodiments.
FIG. 2b shows sheet resistance values for varying thicknesses of PEDOT and the corresponding transmittance, according to some embodiments.

In FIG. 2: (a) Transmittance data for the oCVD PEDOT HTL layers, measured using ultraviolet-visible spectroscopy (UV-Vis) over wavelengths from 350-800 nm. The oCVD PEDOT layers decrease in transmittance and sheet resistance with increasing thickness. The three thinnest PEDOT layers (2, 7, and 15 nm) have high transmittance values (>90% over a majority of the range), which are preferred for HTL layers. (b) Sheet resistance values for each thickness and the transmittance at 550 nm. The oCVD PEDOT sheet resistance was measured using a 4-point probe (taking the average of 10 measurements). With increasing oCVD PEDOT thickness, there are more pathways for charge transfer, so the sheet resistance (Rsh) decreases. Rsh decreases dramatically from the thinnest (2 nm) to thicker PEDOT layers (7, 15, and 40 nm). Transmittance and Rsh values of PEDOT:PSS are also shown for comparison.

In FIG. 3: Comparing HTL coverage on quartz/graphene substrate. (a-c) Spin-coated PEDOT:PSS on quartz/graphene substrate, (d-f) oCVD PEDOT coating on quartz/graphene substrate: (a) schematic illustration of PEDOT:PSS spun-coated on a quartz substrate with graphene electrode. Most of the PEDOT:PSS layer is dewetted from the substrate with dark macroscopic defects visible to the naked eye. (b-c) Optical micrographs (at different magnifications) of the spin-cast PEDOT:PSS on the graphene surface illustrating the poor wettability of PEDOT:PSS on the graphene. In contrast, (d) is the schematic illustration of CVD PEDOT coated via vapor deposition on quartz/graphene substrate, where a uniform coating and patterning via shadow masking is achieved. The left side in (d) has the oCVD PEDOT coating whereas the right side is shadow masked. (e) Optical micrograph and (f) SEM image of oCVD PEDOT on graphene showing uniform coverage.

In FIG. 4: J-V characteristics of representative graphene (3-layer, LPCVD)/ITO OPV devices (Graphene, ITO/PEDOT:PSS (40 nm), vapor printed PEDOT (7-40 nm)/DBP, 25 nm/$C_{60}$, 40 nm/BCP, 7.5 nm/Al, 100 nm) under simulated AM 1.5 G illumination at 100 mW/cm$^2$. (a) Graphene devices with PEDOT:PSS and vapor printed PEDOT (15 nm) HTL, compared with ITO/PEDOT:PSS reference device. (b) Graphene anode based cells with varying thicknesses of vapor printed PEDOT (7, 15, 40 nm). (c) ITO anode devices with varying vapor printed PEDOT thicknesses (7, 15, 40 nm) and a PEDOT:PSS reference. (d) Flat-band energy level diagram of the complete OPV device structure comparing DBP and CuPc electron donors.

Figure 5:
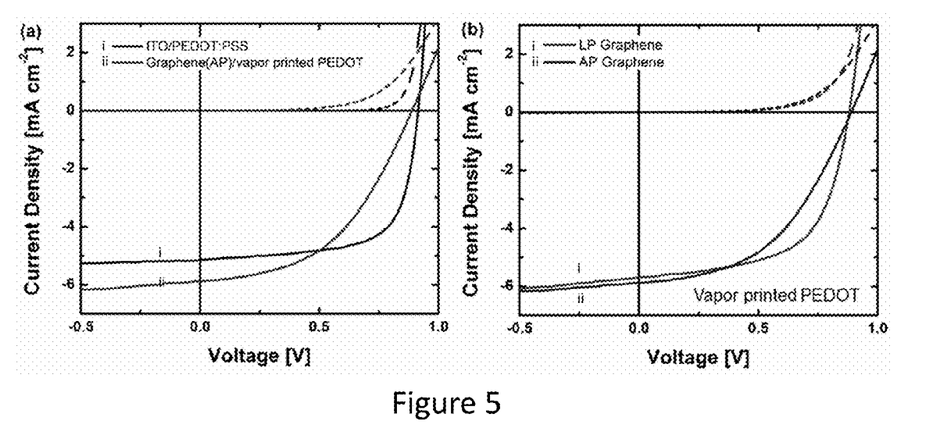

In FIG. 5: (a) J-V characteristics of representative graphene (APCVD) OPV devices (Graphene/vapor printed PEDOT, 15 nm/DBP, 25 nm/$C_{60}$, 40 nm/BCP, 7.5 nm/Al, 100 nm) along with ITO/PEDOT:PSS reference device under simulated AM 1.5 G illumination at 100 mW/cm$^2$. (b) Comparison of graphene-based device performances, where graphene electrodes are prepared under either LPCVD or APCVD conditions.

In FIG. 6: J-V characteristics of representative graphene (3-layer, LPCVD)/ITO solar cell devices with non-ideal diode characteristics under simulated AM 1.5 G illumination at 100 mW/cm$^2$: Graphene, ITO/vapor printed PEDOT (7-40 nm)/DBP, 25 nm/C$_{60}$, 40 nm/BCP, 7.5 nm/Al, 100 nm). (a) Graphene anode solar cells. (b) ITO anode solar cells. Corresponding key photovoltaic parameters of each device are summarized in Table 2.

Experimental Details.

Graphene synthesis (LPCVD, APCVD). Copper foil (25 μm in thickness, ALFA AESAR) was used as a metal catalyst for both conditions. LPCVD. The CVD chamber was evacuated to a base pressure of 30-50 mTorr. The system was then heated to a growth temperature of 1000° C. under hydrogen (H$_2$, 10 sccm) gas (~320 mTorr) and annealed for 30 minutes. Subsequently, methane (CH$_4$, 20 sccm) gas was introduced (total pressure: ~810 mTorr) and graphene growth was carried out for 30 minutes. The chamber was then cooled down at ~45° C./min to room temperature. APCVD. The chamber was heated to 1000° C. under H$_2$ gas (170 sccm) and annealed for 30 minutes. After annealing, H$_2$ was reduced to 30 sccm and CH$_4$ (1 sccm) and Ar (1000 sccm) were additionally introduced followed by 30 minutes of growth. After growth, the chamber was cooled at ~100° C./min to room temperature.

Graphene Transfer and Anode Preparation.

Transfer was carried out using poly(methyl methacrylate) (PMMA, 950 A9, Microchem). Graphene on one side of the foil was removed via reactive ion etching (RIE) with O$_2$ gas (Plasma-Therm, 100 Watt at 7×10$^{-5}$ Torr). Cu was etched by a commercial etchant (CE-100, Transene). Graphene films were then thoroughly rinsed with diluted hydrochloric acid (10%) and de-ionized (DI) water to remove residual iron ions from the Cu etchant. The PMMA layer was removed by annealing at 500° C. for 2 hours under H$_2$ (700 sccm) and Ar (400 sccm). Repeated transfers were performed for 3-layer graphene films. The transferred graphene films were patterned into the desired shape through RIE.

Vapor Printed PEDOT.

The oCVD reactor configuration and general process procedure are known in the art, for example, see Lock, J. P.; Im, S. G.; Gleason, K. K. Macromolecules 2006, 39, (16), 5326-5329. The oCVD PEDOT HTLs were all deposited under the same reaction conditions. The reactor pressure was held at ~10 mTorr and the substrate temperature was maintained at 120° C. The monomer 3,4-ethylenedioxythiophene (Sigma Aldrich, 97%), EDOT, was used as purchased. The EDOT was heated to 140° C. and introduced into the reactor at a flow rate of ~5 sccm. Iron (III) chloride (Sigma Aldrich, 99.99%) was evaporated from a heated crucible between 130-160° C.

Different thicknesses were achieved by varying the time of reaction (1, 2, 4, and 8 minutes respectively to get HTL thicknesses of 2, 7, 15, and 40 nm). (PEDOT:PSS (Clevios™ P VP AI 4083) was filtered (0.45 μm), spin-coated at 4000 rpm for 60 seconds, and annealed at 210° C. for 5 minutes in air). The PEDOT was patterned using a pre-cut metal shadow mask with the same dimensions as the graphene electrode. The mask was visually aligned such that the PEDOT was deposited directly on top of the graphene.

OPV Device Fabrication Process.

Organic layers (DBP (Luminescence Technology Corp., >99%), C$_{60}$ (Sigma Aldrich, 99.9%), BCP (Luminescence Technology Corp., >99%)) and top cathode (Al (Alfa Aesar, 3.175 mm slug, 99.999%)) were thermally evaporated through shadow masks at a base pressure of 1×10$^{-6}$ Torr at rates of 1.0 Å/s and 1.5 Å/s, respectively. C$_{60}$ was purified once via thermal gradient sublimation before use. DBP, BCP, and Al were used as received. Pre-patterned ITO (Thin Film Devices, 20 Ω/sq) substrates were cleaned by solvents followed by 30 seconds of O$_2$ plasma (100 W, Plasma Preen, Inc.). Patterned graphene substrates were cleaned by annealing at 500° C. for 30 minutes under H$_2$ (700 sccm) and Ar (400 sccm). The device area defined by the opening of the shadow mask was 1.21 mm$^2$.

Measurements.

The surface morphology of graphene sheet was characterized by AFM (Dimension 3100, Veeco) and the transmittance was measured from the UV-Vis_NIR spectrometer (Cary 5000, Varian). Work function measurements were performed using a SKP5050 Kelvin probe system from Kelvin Technology Inc. with analysis taken at various locations on each sample with 50 measurements collected per location (using 30 point averaging). Current-voltage measurements were recorded by a Keithley 6487 picoammeter in nitrogen atmosphere. 100 mW cm$^{-2}$ illumination was provided by 150 W xenon arc-lamp (Newport 96000) filtered by an AM 1.5 G filter.

TABLE 1

Optical transmittance (% T) and sheet resistance (R$_{sh}$) of oCVD PEDOT with varying thicknesses described in FIG. 2. PEDOT:PSS values are also shown for comparison.

|  | Transmittance at 550 nm (% T) | R$_{sh}$ (Ω/sq) |
| --- | --- | --- |
| oCVD PEDOT (2 nm) | 98.0 | 100,000 |
| oCVD PEDOT (7 nm) | 96.4 | 3,000 |
| oCVD PEDOT (15 nm) | 94.1 | 900 |
| oCVD PEDOT (40 nm) | 67.4 | 500 |
| PEDOT:PSS (40 nm) | 97.1 | 2,000 |

TABLE 2

Summary of photovoltaic parameters of graphene/ITO devices shown in FIG. 6.

| Anode | HTL | J$_{SC}$ (mA/cm$^2$) | V$_{OC}$ (V) | FF | PCE (%) |
| --- | --- | --- | --- | --- | --- |
| ITO | oCVD PEDOT - 7 nm | 4.93 | 0.73 | 0.32 | 1.16 |
| ITO | oCVD PEDOT - 15 nm | 5.10 | 0.74 | 0.35 | 1.34 |
| ITO | oCVD PEDOT - 40 nm | 5.28 | 0.78 | 0.31 | 1.29 |
| Graphene | oCVD PEDOT - 7 nm | 3.95 | 0.83 | 0.29 | 0.97 |
| Graphene | oCVD PEDOT - 15 nm | 5.30 | 0.75 | 0.30 | 1.20 |
| Graphene | oCVD PEDOT - 40 nm | 5.38 | 0.78 | 0.29 | 1.22 |

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed:

1. An electromagnetic radiation absorbing and/or emitting device, comprising:
   a substrate comprising graphene; and
   poly(3,4-ethylenedioxythiophene) (PEDOT) formed on at least a portion of the graphene, wherein the PEDOT is formed by oxidative chemical vapor deposition, and wherein the thickness of the PEDOT does not vary more than 10%.

2. A method, comprising:
   providing a substrate comprising graphene; and
   depositing, via oxidative chemical vapor deposition, poly (3,4-ethylenedioxythiophene) (PEDOT) on at least a portion of the graphene, wherein the thickness of the PEDOT does not vary more than 10%.

3. The device of claim 1, wherein the power conversion efficiency of the device is at least about 3.0%.

4. The device of claim 1, further comprising:
   a second electrode;
   a photoactive material positioned between the substrate and the second electrode, wherein the PEDOT is positioned between the substrate and the photoactive material.

5. The method of claim 2, wherein the oxidative chemical vapor deposition comprises:
   providing a vapor-phase monomer species and a vapor-phase oxidizing agent to produce a vapor comprising a conductive polymer precursor; and
   contacting the vapor with the surface of the graphene substrate to form a transparent or semi-transparent electrode comprising a conductive polymer on the surface of the graphene substrate.

6. The method of claim 5, wherein the oxidizing agent is $CuCl_2$, $FeCl_3$, $FeBr_3$, $I_2$, $POBr_3$, $GeCl_4$, $SbI_3$, $Br_2$, $SbF_5$, $SbCl_5$, $TiCl_4$, $POCl_3$, $SO_2Cl_2$, $CrO_2Cl_2$, $S_2Cl$, $O(CH_3)_3SbCl_6$, $VCl_4$, $VOCl_3$, $BF_3$, $(CH_3(CH_2)_3)_2O.BF_3$, $(C_2H_5)_3O(BF_4)$, or $BF_3.O(C_2H_5)_2$.

7. The method of claim 5, wherein the oxidizing agent is $FeCl_3$.

8. The method of claim 5, wherein the monomer species is 3,4-ethylenedioxythiophene.

9. The device of claim 4, wherein the second electrode comprises a metal.

10. The device of claim 9, wherein the metal is silver, aluminum, calcium, or gold.

11. The device of claim 4, wherein the photoactive material comprises an electron-accepting material and an electron-donating material.

* * * * *